(12) United States Patent
Arakawa

(10) Patent No.: US 7,274,602 B2
(45) Date of Patent: Sep. 25, 2007

(54) STORAGE DEVICE AND CONTROL METHOD THEREFOR

(75) Inventor: Hideki Arakawa, Kawasaki (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/443,770

(22) Filed: May 30, 2006

(65) Prior Publication Data
US 2006/0280006 A1   Dec. 14, 2006

Related U.S. Application Data

(63) Continuation of application No. PCT/JP2005/009860, filed on May 30, 2005.

(51) Int. Cl.
*G11C 7/00* (2006.01)
(52) U.S. Cl. .................. 365/189.09; 365/226; 365/236
(58) Field of Classification Search ........... 365/189.09, 365/226
See application file for complete search history.

(56) References Cited

U.S. PATENT DOCUMENTS

| | | | |
|---|---|---|---|
| 5,469,399 | A | 11/1995 | Sato et al. |
| 6,128,231 | A | 10/2000 | Chung |
| 6,469,482 | B1 | 10/2002 | Jahanshir et al. |
| 6,628,564 | B1 * | 9/2003 | Takita et al. ............ 365/230.06 |
| 6,744,669 | B2 | 6/2004 | Jahansir et al. |
| 2004/0062078 | A1 | 4/2004 | Kasa et al. |
| 2004/0207362 | A1 | 10/2004 | Kanouda et al. |

FOREIGN PATENT DOCUMENTS

| | | |
|---|---|---|
| JP | H05-083930 | 4/1993 |
| JP | 06084797 | 3/1994 |
| JP | 06150670 | 5/1994 |
| JP | 07021791 | 1/1995 |

(Continued)

OTHER PUBLICATIONS

Sundaram, Rajesh, et al.; A 128 Mb NOR Flah Memory with 3 MB/s Program Time and Low-Power Write Performance by Using In-Package Inductor Charge-Pump; 2005 IEEE International Solid-State Circuits Conference Digest of technical Papers, pp. 50-51, 584 (Feb. 7, 2005).

*Primary Examiner*—Thong Q. Le
(74) *Attorney, Agent, or Firm*—Ingrassia Fisher & Lorenz, P.C.

(57) ABSTRACT

The conductance of a first switch circuit (T1) is periodically controlled in response to an error-amplification circuit (A1) whereby electric power, stored in an inductance circuit (L1) from INPUT VOLTAGE VIN, is released, through a rectifier circuit (D1), to a memory cell array (11) for providing BIAS VOLTAGE VPP stepped up to a set voltage value. At this time, a voltage regulating section (13) acts on the error-amplification circuit (A1) of the stepped up voltage supplying section (12) in response to LOCATIONAL INFORMATION AD about a memory cell as a voltage application target of BIAS VOLTAGE VPP and COUNTER INFORMATION COUNT, and directly regulates the voltage value of BIAS VOLTAGE VPP. Even for large storage capacity devices, it is possible to supply a bias voltage stepped up with a sufficient supply capability to the memory cell array (11). It is also possible to supply an optimum stepped up bias voltage by regulation of the set voltage depending on the position of a target memory cell, regardless of the number of target memory cells and their position.

19 Claims, 8 Drawing Sheets

FOREIGN PATENT DOCUMENTS

| | | |
|---|---|---|
| JP | 09215314 | 8/1997 |
| JP | 11031391 | 2/1999 |
| JP | 11039885 | 2/1999 |
| JP | 2000276888 | 10/2000 |
| JP | 2003319645 | 11/2003 |
| JP | 2004110871 | 4/2004 |
| JP | 2004319367 | 11/2004 |
| WO | WO0203389 | 1/2002 |

* cited by examiner

STORAGE DEVICE AND CONTROL METHOD THEREFOR

CROSS-REFERENCES TO RELATED APPLICATIONS

This is a continuation of International Application No. PCT/JP2005/009860, filed May 30, 2005 which was not published in English under PCT Article 21(2).

TECHNICAL FIELD

The present invention relates in general to a storage device configured to provide a bias voltage to an array of memory cell, and to a method of controlling such a storage device. The present invention is related more specifically to a storage device which has sufficient power supply capability for a memory cell array having large storage capacity and which provides a bias voltage in response to the location of memory cells arranged within the memory cell array, and to a method of controlling such a storage device.

BACKGROUND OF THE INVENTION

Background Art

U.S. Pat. No. 6,744,669 ("Patent Document I") discloses a memory circuit in which a boost voltage, increased in voltage level from that of a power supply VCC and required during REWRITE or ERASE, is fed to an array of memory cells from a booster circuit 200 (see FIG. 7). The booster circuit 200 is made up of an inductor element 210, a switching transistor T1, a diode D1, and a capacitor C2. The switching transistor T1 periodically conducts in response to a periodical control signal. When the switching transistor T1 is conducting, an electric current flows from the power supply VCC through the inductor element 210 and the switching transistor T1 to ground potential, thereby storing electric energy in the inductor element 210. On the other hand, when the switching transistor T1 enters the non-conductive state, the drain terminal voltage of the switching transistor T1 rises, and current flows to the capacitor C2 by way of the diode D1, thereby stepping up the terminal voltage of the capacitor C2 above the power supply VCC and outputting the stepped up voltage at an output terminal OUTPUT.

Additionally, with reference to FIG. 8, Japanese Patent Application Publication JP 1994-150670 ("Patent Document II") describes a program circuit section in a non-volatile memory device. Memory cells M1-M8 are shown by way of example only. Word lines W0-Wm and data lines D0, D1, Dj, Dj+1 together form an array of memory cells.

The data lines D0-Dj+1 are connected, respectively through vertical row selecting switches MOSFETs Q20, Q21, Q24, Q25 (which receive, respectively, selection signals Y0, Y1, Yj, Yj+1) to a common data line CD. The common data line CD is connected to an output terminal of a write load circuit WA0.

The write load circuit WA0 is formed by a series circuit which is made up of a MOSFET Q15 which receives OUTPUT SIGNAL DD1 from a write data inputting buffer, a variable resistor circuit VR, and a MOSFET Q17 which receives CONTROL SIGNAL PROG. The voltage from a high-voltage terminal VPP is supplied to the common data line CD via the write load circuit WA0. In order to prevent one memory cell located near a data line from differing in write depth from another located distant from the data line, Block Selection Address AX, for selecting a memory block (not shown) defined as a result of partitioning the memory array in the direction of the data line, is fed to a block decoder circuit DE, and the resistance value of the variable resistor VR is regulated depending on the selected memory block, thereby creating a write voltage which compensates for the amount of voltage drop due to the resistance component of the data line.

With reference to FIG. 9, there is shown a specific example of the write load circuit WA0. The block decoder circuit DE is fed two 1-bit Address Signals A8B, A9B, and generates three different Selection Signals SS0-SS2. The variable resistor VR is made up of MOSFETs Q1-Q4 arranged in parallel. The gate of the MOSFET Q1 is constantly fed Bias Voltage VP, thereby setting a maximum resistance value. As the combination of Selection Signals SS0-SS2 which switch to a logic high state in response to Address Signals A8B, A9B, the number of MOSFETs that will conduct varies. In this manner, the resistance value of the variable resistor VR is regulated.

Problems that the Invention to Solve

In conventional flash memory storage devices, a boost voltage, necessary for memory cell operations such as REWRITE and ERASE, is generated by a boost voltage generating circuit that utilizes a charge pump function. Contrary thereto, in the booster circuit 200 of Patent Document I, the inductor element 210 periodically stores energy therein. Then, the stored energy is transferred to the capacitor C2 to provide a boosted voltage to the output terminal OUTPUT. In comparison to a boost voltage generating circuit that utilizes a charge pump function, the booseter circuit 200 is able to provide greater electric power. In addition, for storage devices having larger storage capacity, Patent Document 1 intends to provide an effective stepped up voltage to a memory cell array.

However, with an increase of storage capacity, the memory cell array inevitably requires larger layout regions. As a result, each memory cell as a target for REWRITE or ERASE has a different distance to the booster circuit 20, from other target memory cells depending on their location within the memory cell array. This may create the possibility that, due to the drop in voltage in a boost voltage routing path extending to a target memory cell, a boost voltage to be applied to the memory cell is stepped down. In this case, voltages differing in voltage value from one memory cell position to another are stored in the memory cells for the same operation.

To accommodate this drawback in the prior disclosed in Patent Document I, the resistance value on the routing path of a boost voltage supplied from the booster circuit 200 can be variable by the use of the technique disclosed in Patent Document II, thereby making it possible to regulate the value of a voltage that is applied to memory cells.

The circuitry disclosed in Patent Document II, however, is not intended to directly regulate the voltage value of a boost voltage outputted from the booster circuit 200. An electric current, which flows during provision of a boost voltage applied via the high-voltage terminal VPP to a memory cell through the variable resistor VR of the load circuit WA0, is used to produce a voltage drop for voltage value regulation. Consequently, if the stepped up voltage is a voltage to be applied to a high-resistance node and no electric current flows through an applied voltage routing path, then the drop in voltage by the variable resistance VR will not take place. The drawback of the prior art is that it is impossible to achieve voltage value regulation depending on the location of memory cells.

Additionally, when performing simultaneous application of a boost voltage on a plurality of memory cells, the memory cells, as a result of such simultaneous voltage application, enter a predetermined state (program completion or erase completion) and the length of time to complete the voltage applying operation generally differs from one memory cell to another. In other words, the number of memory cells that complete having undergone a voltage applying operation increases with elapse of time from initial voltage application. If no further voltage applying operation is performed on these voltage application completed memory cells, the amount of electric current flowing through the voltage applying routing path gradually decreases with time. Even when the resistance value of the variable resistor VR is regulated depending on the memory cell location by address signals, the stepped up voltage varies with time, which further prevents determining the stepped up voltage in response to the memory cell location.

SUMMARY OF THE INVENTION

Means for Solving the Problems

The present invention addresses one or more of the problems with the above-described prior art techniques. Accordingly, an object of the present invention is to provide a storage device capable of supplying an optimum stepped up voltage and a method of controlling such a storage device, regardless of the number of memory cells as targets for voltage application and their layout location by supplying, even in large storage capacity devices, a boost voltage with sufficient supply capability to a memory cell array. In accordance with the present invention, electric power, stored in an inductance element from the input voltage, is periodically released to the output side to maintain the output voltage at a set voltage level, and the set voltage of a boost voltage supplying circuit is directly regulated in response to the target memory cell location within the memory cell array. In addition, another object of the present invention is to provide a storage device capable of supplying an optimum stepped up voltage and a method of controlling such a storage device by supplying a boost voltage with sufficient supply capability to a memory cell array and directly regulating the set voltage of a boost voltage supplying circuit, if needed.

A storage device in accordance with the present invention achieves objects stated above includes a memory cell array, a boosted-voltage supplying section which supplies a bias voltage to the memory cell array, the bias voltage being generated by boosting an input voltage, and a voltage regulating section which regulates a set voltage, wherein the voltage regulating section sets a voltage value of the bias voltage in response to at least one position in the memory cell array which is to be supplied with the bias voltage, and/or a number of times that the bias voltage is applied to the memory cell array, and a verify operation after the application of the bias voltage which outputs a regulated voltage regulated in response to at least one of the set voltage and the bias voltage, wherein the boosted-voltage supplying section includes an error-amplification circuit which amplifies an error voltage with a value deviated from the set voltage of the bias voltage in response to the set voltage and/or the regulated voltage, after regulation thereof, an inductance circuit coupled between the input voltage and a first node, a first switch circuit coupled between the first node and a reference voltage, and a rectifier circuit coupled between the first node and the memory cell array, the rectifier circuit being energized in a direction from the first node to the memory cell array, wherein the first switch circuit, or the first switch circuit and the rectifier circuit is periodically energized in response to operation of the error-amplification circuit.

In a storage device configured in accordance with the present invention, when the first switch circuit is conductive, an electric current routing path is formed extending from the input voltage to the reference voltage by way of the first node, thereby storing electric power in the inductance circuit. When the first switch circuit is placed in a non-conductive state, the electric power stored in the inductance circuit is supplied, through the first node and the rectifier circuit, to the memory cell array as a bias voltage. The voltage regulating section regulates the set voltage in response to a supply location of a bias voltage, the number of times the bias voltage is applied, and/or a verify operation after application of the bias voltage and outputs a regulated voltage regulated in response to at least one of the set voltage and the bias voltage. The regulated set voltage or the regulated voltage or both are supplied to the error-amplification circuit and an error voltage with a value differing from the set voltage of the bias voltage is amplified. The conductivity of the first switch circuit or the continuity of the first switch circuit and the rectifier circuit is then controlled in response to an output signal from the error-amplification circuit to periodically transmit electric power.

Furthermore, a storage device controlling method in accordance with the present invention includes the steps of regulating a set voltage of a bias voltage in response to a position in a memory cell array which is to be supplied with the bias voltage and/or a number of times that the bias voltage is applied to the memory cell array and/or a verify operation after application of the bias voltage which outputs a regulated voltage regulated in response to one of a set voltage and the bias voltage, and managing the bias voltage in response to the set voltage by periodically storing power of an input voltage in an inductance circuit and then supplying the power to the memory cell array.

In the storage device controlling method in accordance with the present invention, the set voltage of the bias voltage is regulated in response to one of the location of memory cells (within a memory cell array) as supply targets of the bias voltage that is supplied to the memory cell array, the number of times the bias voltage is applied, and the verify operation after the application of the bias voltage, after which the bias voltage is maintained at a set voltage value by supplying, after periodically storing electric power of the input voltage in the inductance circuit, the stored electric power to the memory cell array.

EFFECTS OF THE INVENTION

Accordingly, even when storage capacity is increased, the operation of releasing electric power stored in an inductance circuit from the input voltage towards the memory cell array is periodically controlled to maintain the bias voltage at a set voltage value, thereby making enabling provision of a bias voltage having a sufficient supply capability for the memory cell array. In addition, the bias voltage is directly regulated by the set voltage regulation in response to any one of (a) the location of target memory cells within the memory cell array, (b) the number of times the bias voltage is applied, or (c) the verify operation after the application of the bias voltage, thereby enabling release of the electric power stored in the inductance circuit towards the memory cell array from the rectifier circuit. Therefore, in accordance with the present invention it is possible to provide optimum bias voltages in response to the memory cell location regardless of the number of memory cells targeted for bias voltage application.

DETAILED DESCRIPTION OF THE INVENTION

Hereinafter, with reference to FIGS. 1 through 6, specific embodiments of the storage device and storage-device controlling method in accordance with the present invention are described in detail.

Figure 1:
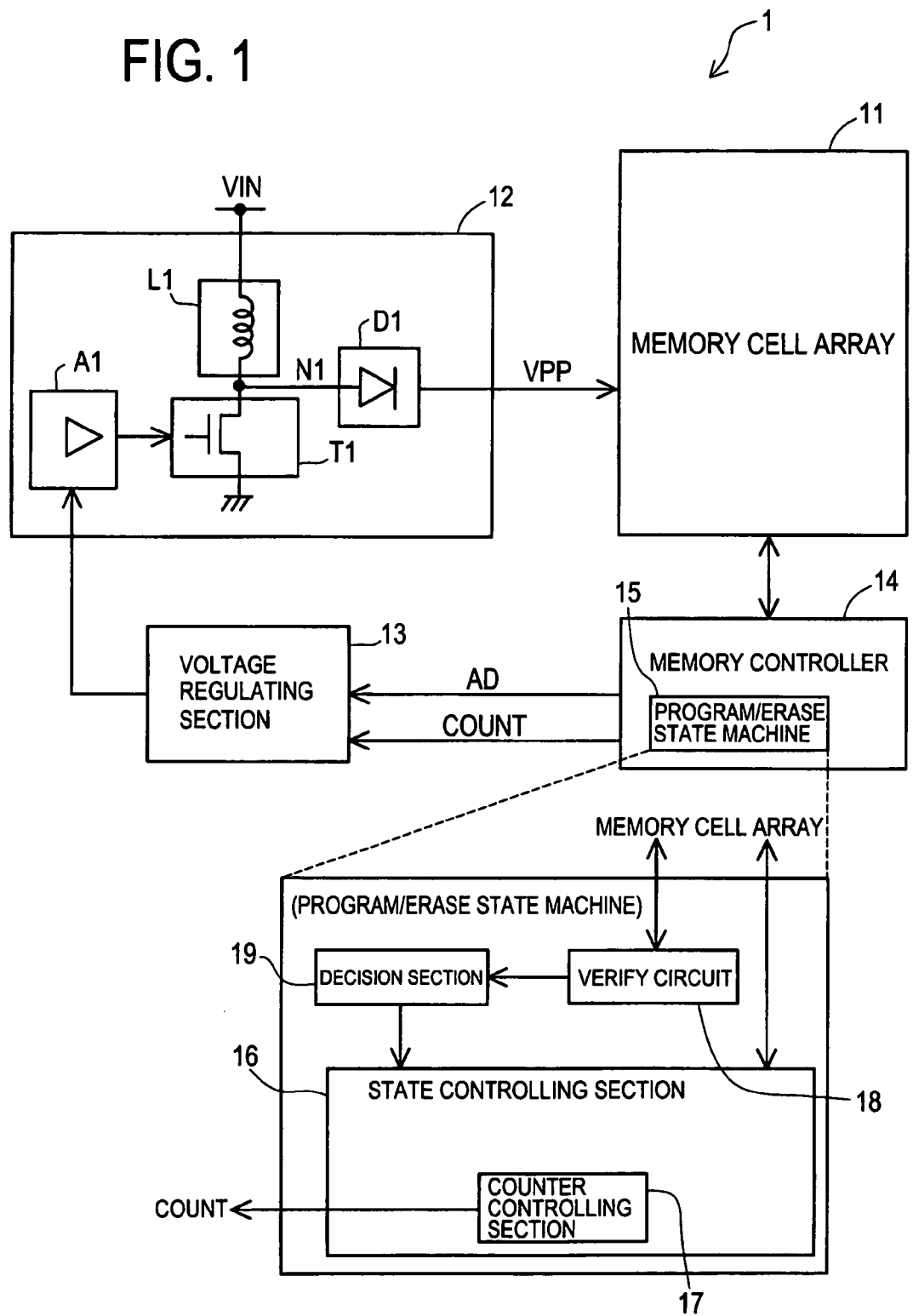
FIG. 1 is a block diagram for providing an explanation of the fundamental principle of the present invention.

Referring first to FIG. 1, a boost voltage supplying section 12 is coupled to a memory cell array 11 for providing BOOSTED BIAS VOLTAGE VPP thereto. A voltage regulating section 13 regulates the voltage value of BIAS VOLTAGE VPP supplied from the stepped up voltage supplying section 12 and a memory controller 14 controls the memory cell array 11.

In addition, the memory controller 14 is provided with a program/erase state machine 15 operable to program or erase memory cells within the memory cell array 11. The program/erase state machine 15 includes a state controlling section 16 having a counter controlling section 17, a verify circuit 18, and a decision section 19.

The state controlling section 16 controls timing for voltage application to or implanting/releasing hot electrons or hot carriers in the memory cells during PROGRAM or ERASE, and/or verify functions therefor. At the time of PROGRAM or ERASE, the verify circuit 18 compares the program or erase state of a memory cell with an expected value for each voltage application or for each cycle (wherein a plurality of voltage applications serve as one set or cycle).

The decision section 19 decides, in response to the comparison/verification data from the verify circuit 18, whether all memory cells targeted for PROGRAM or ERASE have entered the program state or the erase state, respectively.

The counter controlling section 17 sets the number of times the aforesaid voltage is applied and monitors verify operations. The state controlling section 16 decides, based on the result from the decision section 19 and on the information of the counter controlling section 17, whether PROGRAM or ERASE is to be terminated and whether further voltage for PROGRAM or ERASE is to be provided. In addition, the state controlling section 16 controls the application of voltage to the memory cells. The counter controlling section 17 monitors the provision of pulses of BIAS VOLTAGE VPP and the verify operation which are conducted in accordance with the control operation of the state controlling section 16 and outputs COUNTER INFORMATION COUNT in response to the predetermined number of times of VPP application and/or the verify operation.

For example, verification is conducted after a predetermined number of voltage pulses have been provided. The counter controlling section 17 controls the number of times the voltage pulses are provided. Generally, the pulse voltage is changed by regulation of the applied voltage every n times of pulse application (n≧1) (called "step pulse application"). In accordance with another example, every time further voltage is applied for PROGRAM or ERASE, the pulse voltage is changed by regulation of the applied voltage (called "verify step application") in that the set value of the applied voltage is changed for each verification. Both of these examples are performed to improve the characteristics of PROGRAM/ERASE on the memory cells. Either or both of the BIAS VOLTAGE VPP at the time of step pulse application or the BIAS VOLTAGE VPP at the time of verify step application is generated by the stepped up voltage supplying section 12, described hereinafter.

The stepped up voltage supplying section 12 is provided with an error-amplification circuit A1 for amplifying an error voltage by a voltage value determined from the set voltage of BIAS VOLTAGE VPP, an inductance circuit L1 for establishing a connection between INPUT VOLTAGE VIN and a first node N1, a first switch circuit T1 which establishes connection between the first node N1 and ground voltage and whose continuity is periodically controlled in response to an output from the error amplifier circuit A1, and a rectifier circuit D1 which conducts from the first node N1 towards the memory cell array 11.

The first switch circuit T1 operates in response to the error-amplification circuit A1 and, when conductive, forms an electric current routing path which extends to ground voltage from INPUT VOLTAGE VIN through the inductance circuit L1, thereby storing electric power in the inductance circuit L1. Thereafter, the first switch circuit T1 is placed in a non-conductive state, cutting off the electric current routing path extending to ground voltage. In response to cutting-off the electric current routing path, the electric power stored in the inductance circuit L1 is released and provided, through the rectifier circuit D1, to the memory cell array 11. The first switch circuit T1 is periodically controlled, as a result of which BIAS VOLTAGE VPP is periodically provided to the memory cell array 11.

In response to LOCATIONAL INFORMATION AD about a memory cell in the memory cell array 11 as a voltage application target of BIAS VOLTAGE VPP and COUNTER INFORMATION COUNT, the voltage regulating section 13 outputs a signal to the stepped up voltage supplying section 12. The error-amplification circuit A1, in response to this signal, regulates the voltage value of BIAS VOLTAGE VPP. LOCATIONAL INFORMATION AD is, for example, address information identifying a memory cell as a voltage application target of BIAS VOLTAGE VPP.

Electric power supplied from INPUT VOLTAGE VIN is stored in the inductance circuit L1 and, thereafter, released through the rectifier circuit D1, thereby making it possible to provide STEPPED UP BIAS VOLTAGE VPP. Consequently, it becomes possible to perform a voltage step up operation wherein more electric power is released as compared with a charge pump function utilizing the transfer of electric charges by capacitative coupling.

Furthermore, in response to LOCATIONAL INFORMATION AD and COUNTER INFORMATION COUNT, the voltage value of BIAS VOLTAGE VPP outputted from the stepped up voltage supplying section 12 can be directly controlled. It is thus possible to provide BIAS VOLTAGE VPP having a predetermined voltage value regardless of the size of load in the memory cell array to which BIAS VOLTAGE VPP is supplied. In other words, regardless of the amount of electric current that the memory cell array requires from the stepped up voltage supplying section 12, BIAS VOLTAGE VPP can be provided having a predetermined voltage value.

Figure 2:
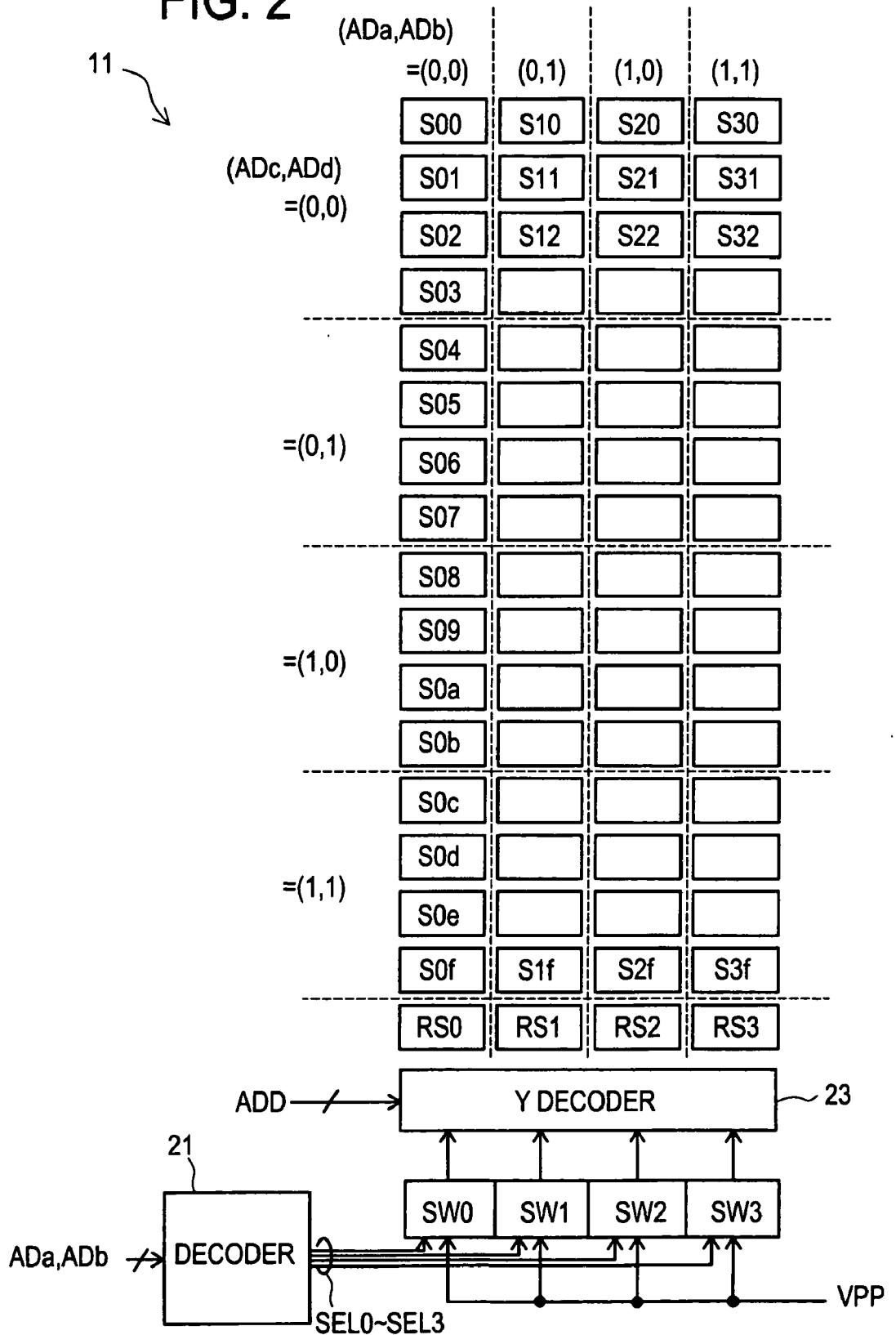
FIG. 2 is a schematic block diagram of an array of memory cells in accordance with an embodiment of the present invention.

Referring to FIG. 2, a schematic block diagram of the memory cell array 11 is shown. In the memory cell array 11, memory cells (not shown) are arranged vertically and horizontally in a matrix and sectors S00-S3f are formed. These sectors S00-S3f are units defined as a result of partitioning the memory cells per every predetermined number thereof from the access control point of view for the sectors S00-S3f and/or from the circuit/layout configuration point of view. For example, in a non-volatile memory device, a sector is a basic unit for a batch erase operation or a program operation.

As seen in FIG. 2, four sectors are arranged in each horizontal row and sixteen sectors are arranged in each vertical row, for a total of sixty-four sectors. In addition, the memory cell array 11 has a Y decoder 23 for decoding ADDRESS SIGNAL ADD that contains ADDRESS SIGNAL ADa and ADDRESS SIGNAL ADb, second switch circuits SW0-SW3 for providing BIAS VOLTAGE VPP to associated, vertical sector rows, and a decoder 21 for decoding ADDRESS SIGNALS ADa, ADb and for outputting SELECTION SIGNALS SEL0-SEL3 to the second switch circuits SW0-SW3. In addition, redundant sectors RS0-RS3 are provided for each vertical sector row. Each sector group in a respective vertical row which is decoded by the Y decoder 23 is connected to a common bit line, thereby adding parasitic resistance to the wiring routing path of the common bit line.

Sectors S00-S3f are arranged vertically and horizontally in matrix fashion and each lateral sector row is identified by ADDRESS SIGNALS ADa, ADb. Arranged in a first sector row identified by ADDRESS SIGNALS (ADa, ADb)=(0, 0) are the sectors S00-S0f and the redundant sector RS0, in a second sector row identified by ADDRESS SIGNALS (ADa, ADb)=(0, 1) are the sectors S10-S1f and the redundant sector RS1, in a third sector row identified by ADDRESS SIGNALS (ADa, ADb)=(1, 0) are the sectors S20-S2f and the redundant sector RS2, and in a fourth sector row identified by ADDRESS SIGNALS (ADa, ADb)=(1, 1) are the sectors S30-S3f and the redundant sector RS3. In addition, identification is made for every four vertically adjacent sectors by ADDRESS SIGNAL ADc and ADDRESS SIGNAL ADd. More specifically, if ADDRESS SIGNALS (ADc, ADd)=(0, 0), this identifies a partition of sectors Sx0-Sx3 (x=0 to 3). Likewise, ADDRESS SIGNALS (ADc, ADd)=(0, 1) identifies a partition of sectors Sx4-Sx7 (x=0 to 3), ADDRESS SIGNALS (ADc, ADd)=(1, 0) identifies a partition of sectors Sx8-Sxb (x=0 to 3), and ADDRESS SIGNALS (ADc, ADd)=(1, 1) identifies a partition of sectors Sxc-Sxf (x=0 to 3).

During application of BIAS VOLTAGE VPP, target memory cells (not shown) are designated by an address signal including ADDRESS SIGNALS ADa-ADd. The decoder 21 decodes ADDRESS SIGNALS ADa, ADb, and, in response thereto, selects one of the second switch circuits SW0-SW3 (i.e., whichever is disposed in a lateral sector row where the target memory cell is located). Then, BIAS VOLTAGE VPP is supplied, through the selected second switch circuit and through the Y decoder 23, to the target memory cell by way of a bit line.

As is known to those skilled in the art, bad memory cells, bad sectors etc. are replaced with given redundant sectors (i.e., RS0-RS3) in response to a redundancy decision circuit (not shown). With reference to FIG. 2, the embodiment of the present invention is designed such that a bad sector is replaced with a redundant sector arranged in the same sector row as the bad sector. In this manner, the second switch circuit SW0-SW3 which is decoded and selected by the decoder 21 selects the same sector row, regardless of the presence or absence of the need for replacement of a bad sector with a redundant sector.

In some redundancy configurations and/or redundancy controlling methods, it is possible that a target memory cell and a redundant sector with which the target memory cell is replaced are located in different sector rows, for example, when, instead of providing a respective redundant sector to each row, a single redundant sector is shared between a plurality of sector rows, and when, in order to enhance the efficiency of redundancy remedy, a target memory cell is replaced with a redundant sector arranged at a different sector row from a sector row in which a bad sector is located (so-called "flexible redundancy").

Whatever the redundancy scheme, a redundancy decision signal (not shown) or address information about a sector row where a replacement redundant sector is located is inputted to the decoder 21. Therefore, in the case where a single redundant sector is shared between a plurality of sector rows, it is possible to select a specific sector row in response to the input of a redundancy decision signal, regardless of the decoding of ADDRESS SIGNALS ADa, ADb. On the other hand, for the case of the replacement with a redundant sector that is located in a different sector row, it is possible to select a sector row where a redundant sector is located by decoding, in place of ADDRESS SIGNALS ADa, ADb, address information about the sector row where the redundant sector is located, in response to the input of a redundancy decision signal.

Sector rows arranged in the lateral direction are identified by ADDRESS SIGNALS ADa, ADb, while, for the vertically arranged sectors, identification is made per every four sectors by ADDRESS SIGNALS ADc, ADd. In response to ADDRESS SIGNALS ADa-ADd, with respect to each sector row, the layout region of the memory cells is partitioned by every four sectors into sub-regions. These sub-regions differ from each other in distance from the stepped up voltage supplying section 12 as well as in routing path load. Additionally, with respect to the redundant sectors RS0-RS3, the distance from the stepped up voltage supplying section 12 and the routing path load differ from one sector row to another. Accordingly, as will be described later, it is effective to regulate the voltage value of OUTPUTTED BIAS VOLTAGE VPP in response to the ADDRESS SIGNALS ADa-ADd or the replacement redundant sector.

Figure 3:
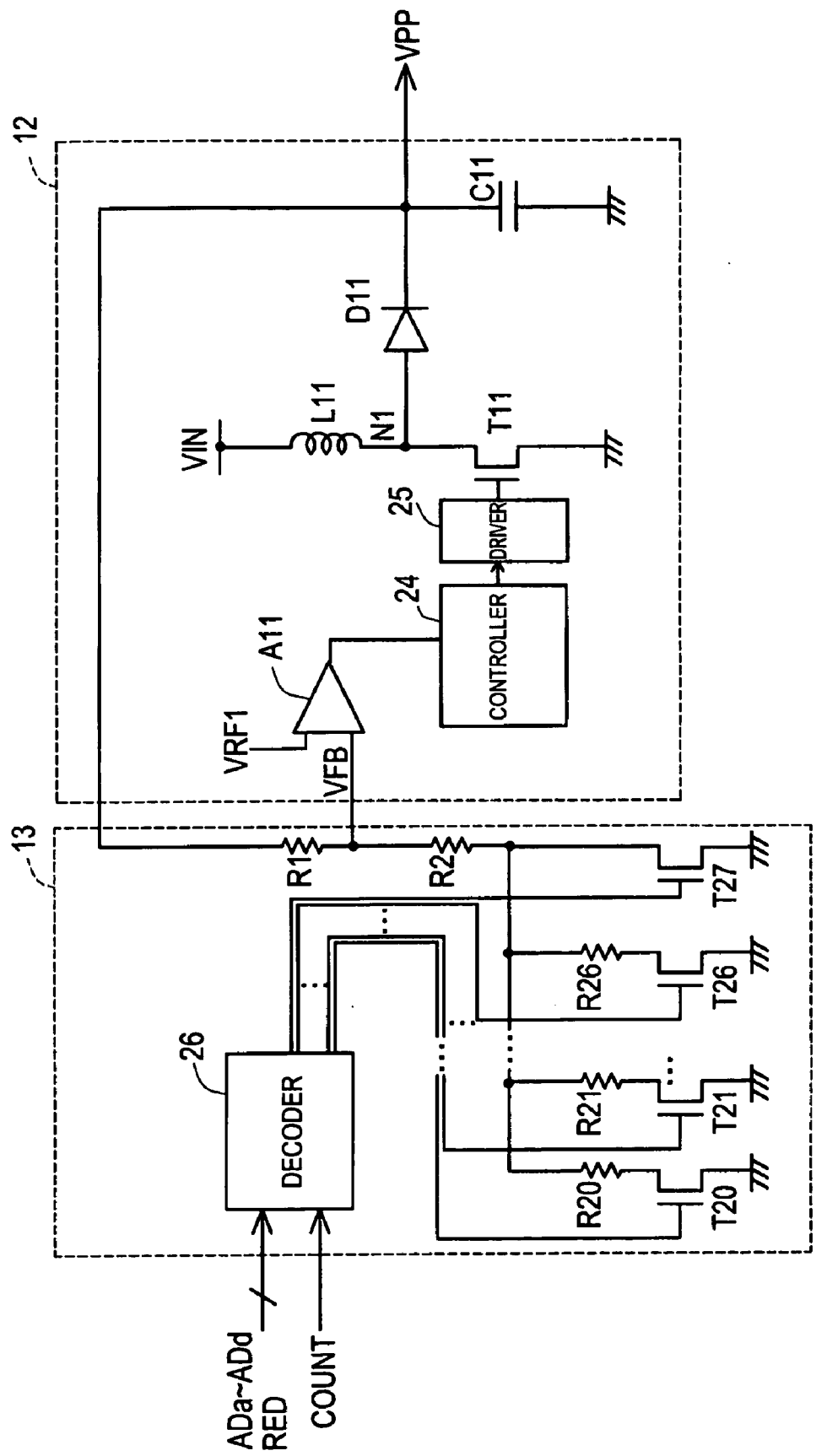
FIG. 3 is a circuit block diagram illustrating a boost voltage supplying section and a voltage regulating section in accordance with the embodiment of the present invention.

FIG. 3 shows a boost voltage supplying section 12 and a voltage regulating section 13 in accordance with an embodiment of the present invention. The stepped up voltage supplying section 12 includes an error amplifier A11, an inductance element L11, a switching element T11, a rectifier element D11, and a capacitor element C11. One end of the inductance element L11 and one end of the switching element T11 are connected together at a first node N1. The other end of the inductance element L11 is connected to INPUT VOLTAGE VIN. The other end of the switching element T11 is connected to ground voltage. Additionally, the anode and the cathode terminal of the rectifier element D11 are connected, respectively, to the first node N1 and to an output terminal VPP. The capacitor element C11 is coupled between the output terminal VPP and ground voltage. FEEDBACK VOLTAGE VFB (which is a feedback of OUTPUTTED BIAS VOLTAGE VPP and SET VOLTAGE VRF1) is provided to the error amplifier A11 and any error between FEEDBACK VOLTAGE (REGULATION VOLTAGE) VFB and SET VOLTAGE VRF1 is amplified thereby. FEEDBACK VOLTAGE VFB is a regulated voltage derived by regulating the BIAS VOLTAGE VPP by resistive potential division. In addition, although not shown diagrammatically, it is possible to regulate, by resistive potential division, SET VOLTAGE VRF1 to also provide a regulated voltage.

A controller 24 and a driver 25 are provided to control the switching element T11 is controlled. The error amplifier A11 provides its output signal to the controller 24. In response to the amplified error voltage, the controller 24 outputs a control signal to the switching element T11 through the driver 25, thereby controlling the switching element T11.

The control signal which is outputted from the controller 24 and which controls the switching element T11 is periodically controlled so that OUTPUTTED BIAS VOLTAGE VPP is maintained at a predetermined voltage value. To this end, there is a control method capable of holding BIAS VOLTAGE VPP at a predetermined voltage value, for example, by repetition of conduction and non-conduction at a predetermined frequency for releasing electric power to the output terminal of the boost voltage supplying section 12. This is a switching control technique that is generally referred to as "PWM control". The switching element T11 is controlled to open and close every predetermined time cycle, so that electric power is supplied every cycle. PWM control is a control technique which proves effective for higher power consumption of SUPPLIED BIAS VOLTAGE VPP, thereby providing sufficient electric power as BIAS VOLTAGE VPP.

In addition to the above technique, there is another control technique for controlling the switching element T11 in response to the drop in BIAS VOLTAGE VPP. This is a control technique in which BIAS VOLTAGE VPP is monitored and the switching element T11 is controlled in response to VPP falling below a predetermined value. This is a switching control technique that is generally referred to as "VFM control". When BIAS VOLTAGE VPP has a sufficient voltage value (eliminating the need to provide a further supply of electric power), no switching operations are carried out. This makes it possible to prevent unnecessary circuit operations, thereby providing a control technique that proves effective when power consumption is small at SUPPLIED BIAS VOLTAGE VPP by suppressing unnecessary power consumption.

The voltage regulating section 13 includes resistance elements R1, R2, and R20 to R26 for voltage division of BIAS VOLTAGE VPP. BIAS VOLTAGE VPP is provided to one end of the resistance element R1. The other end of the resistance element R1 is connected to one end of the resistance element R2. Connected in series between the other end of the resistance element R2 and ground voltage are a parallelly-connected combinations of the resistance elements R20 to R26 and switching transistors T20 to T26, respectively. In addition, a switching transistor T27 is also connected between the other end of the resistance element R2 and ground voltage. The switching transistors T20-T27 are selectively controlled by the decoder 26 which receives ADDRESS SIGNALS ADa-ADd and REDUNDANT SIGNAL RED.

The resistance elements R20-R26 have different resistance values which are added to the resistance element R2 under control of the switching transistors T20-T26, and BIAS VOLTAGE VPP is voltage-divided between the resistance elements R1, R2 to provide FEEDBACK VOLTAGE (REGULATION VOLTAGE) VFB. The routing path of the switching transistor T27 is a routing path that has no resistance value to add to the resistance element R2. In this manner, FEEDBACK VOLTAGE VFB is outputted from a connection point between the resistance element R1 and the resistance element R2 and is a voltage which is generated as a result of voltage division of BIAS VOLTAGE VPP and corresponds to a voltage division ratio formed by the routing path of any one of the switching transistors T20-T27 that is controlled to be conductive. When the switching transistor T27 is made conductive, the voltage value increases to a maximum, and FEEDBACK VOLTAGE (REGULATION VOLTAGE) VFB is regulated such that its voltage value sequentially decreases as the resistance value of the resistance elements R20-R26 increases.

In response to ADDRESS SIGNALS ADa-ADd, REDUNDANT SIGNAL RED, and COUNTER INFORMATION COUNT, the decoder 26 determines an optimum voltage value and then controls one of the switching transistors T20-T27 to make it conductive.

Figure 4:
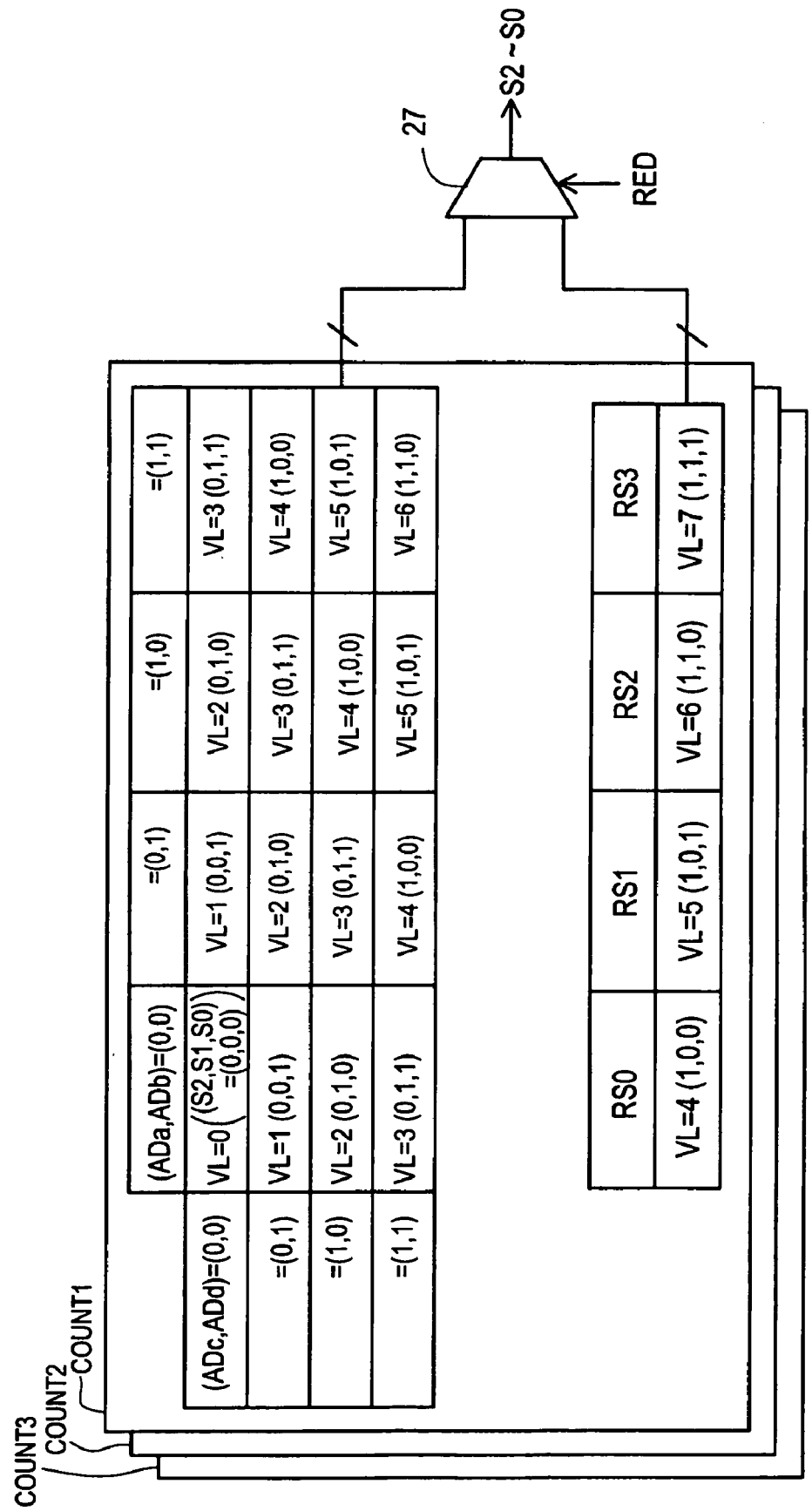
FIG. 4 is a diagram showing a regulation of the bias voltage depending on the sector location in accordance with the embodiment of the present invention.

FIG. 4 shows, for the decoder 26, a preferable example of the correspondence of BIAS VOLTAGE VPP to the location information of the sectors and COUNTER INFORMATION COUNT (1-3) in accordance with the embodiment of the present invention. In a first correspondence table, BIAS VOLTAGE VPP is regulated per every sector row arranged in lateral direction and per every partition of four sectors vertically adjacent to each other. BIAS VOLTAGE VPP is regulated to eight stages, i.e., regulation levels VL0-VL7, by three one-bit signals (REGULATION SIGNALS S2-S0). REGULATION SIGNALS S2-S0 are further decoded for controlling the switching transistors T20-T27. More specifically, if (S0, S1, S2)=(0, 0, 0), then the switching transistor T27 is controlled and BIAS VOLTAGE VPP increases to a maximum. It should be noted that multiple first correspondence table are provided (i.e., COUNT1, COUNT2, COUNT3) so as to correspond to COUNTER INFORMATION COUNT.

In a second correspondence table pertaining to the redundant sectors RS0-RS3, BIAS VOLTAGE VPP is regulated, per every arranged sector row, to four stages, i.e., regulation levels VL4-VL7, by REGULATION SIGNALS S2-S0. In this manner, REGULATION SIGNALS S2-S0 are selected either in response to ADDRESS SIGNALS ADa-ADd in the first corresponding table or in response to the redundant sectors RS0-RS3 in the second corresponding table when selecting a redundant sector. It should be noted that the multiple second correspondence tables are also provided (COUNT1, COUNT2, COUNT3) so as to correspond to COUNTER INFORMATION COUNT.

In the block diagram of FIG. 2, BIAS VOLTAGE VPP is provided from the side of the memory cell array 11 including the redundant sector RS3 and the sector column that is identified by ADDRESS SIGNALS (ADa, ADb)=(1, 1). Consequently, the sector S3f and the redundant sector RS3 are located closest to the stepped up voltage supplying section 12. The load on a routing path to the sector (i.e., the total of the parasitic resistance of the power supply line of BIAS VOLTAGE VPP and the parasitic resistance of the bit line) decreases to a minimum, and the minimum voltage level is supplied at an adequate regulation level. For the other sectors arranged further away from the stepped up voltage supplying section 12 (the remotest one is the sector S00), the BIAS VOLTAGE VPP is regulated to sequentially increase to higher voltage levels, i.e., in the order of (1, 1)→(1, 0)→(0, 1)→(0, 0) of ADDRESS SIGNALS (ADa, ADb) and in the order of (1, 1)→(1, 0)→(0, 1)→(0, 0) of ADDRESS SIGNALS (ADc, ADd).

More specifically, in the first corresponding table, in a sector column identified by (ADa, ADb)=(1, 1), the regulation voltage level is regulated to sequentially increase in the order corresponding to: VL6→VL5→VL4→VL3 in accordance with (ADc, ADd)=(1, 1)→(1, 0)→(0, 1)→(0, 0). Likewise, in a sector column identified by (ADa, ADb)=(1, 0), the regulation voltage level is regulated to sequentially increase in the order corresponding to: VL5→VL4→VL3→VL2; in a sector column identified by (ADa, ADb)=(0, 1), the regulation voltage level is regulated to sequentially increase in the order corresponding to: VL4→VL3→VL2→VL1; and in a sector column identified by (ADa, ADb)=(0, 0), the regulation voltage level is regulated to sequentially increase in the order corresponding to: VL3→VL2→VL1→VL0. In addition, in the second corresponding table, in regard to the redundant sectors, in accordance with RS3→RS2→RS1→RS0, the regulation voltage level is regulated to sequentially increase in the order corresponding to: VL7→VL6→VL5→VL4.

Either one of the regulation signal S2-S0 selected in the first corresponding table and the regulation signal S2-S0 selected in the second corresponding table is selected by a selector 27. The selector 27 makes such selection in response to REDUNDANT SIGNAL RED. In other words, if REDUNDANT SIGNAL RED is in a non-active state and a target sector is not backed up by redundancy remedy, then the first corresponding table is selected. On the other hand, if REDUNDANT SIGNAL RED is in an active state and a target sector is backed up by redundancy remedy, then the second corresponding table is selected. The plural first and second correspondence tables correspond to COUNTER INFORMATION COUNT and REGULATION SIGNALS S2-S0 are outputted in accordance with either one of the first and second corresponding tables. More specifically, during the first program voltage application cycle, the first and second corresponding tables within COUNTER INFORMATION COUNT1 are selected; during the second program voltage application cycle, the first and second corresponding tables within COUNTER INFORMATION COUNT2 are selected; and during the third program voltage application cycle, the first and second corresponding tables within COUNTER INFORMATION COUNT3 are selected. This makes it possible to generate, during every program voltage application cycle, OPTIMUM BIAS VOLTAGES VPP including both OPTIMUM BIAS VOLTAGE VPP by sector location information and OPTIMUM BIAS VOLTAGE VPP by COUNTER INFORMATION COUNT.

Figure 5:
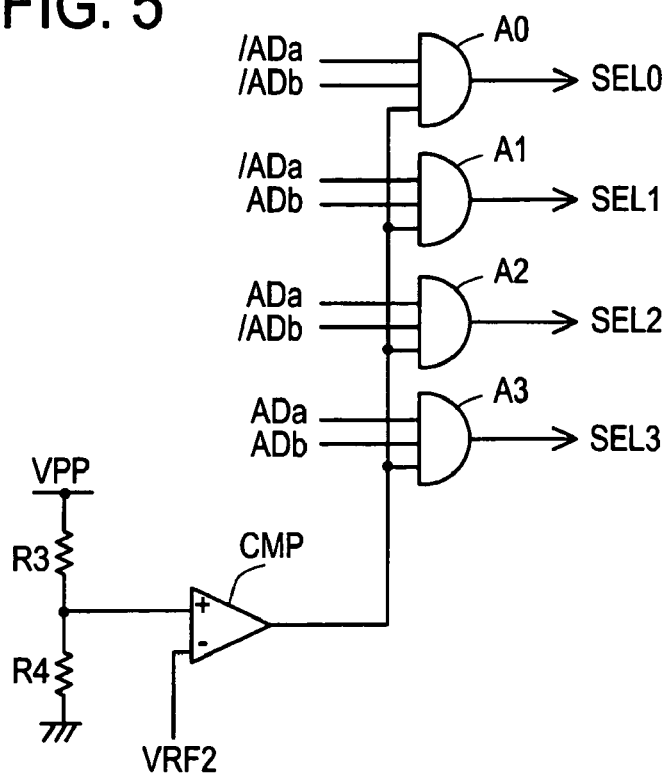
FIG. 5 illustrates an embodiment of a decoder which selects a second switch circuit in accordance with the embodiment of the present invention.

With reference to FIG. 5, there is shown an alternate embodiment of the decoder 21 in accordance with the present invention. FIG. 2 provides a description of the case where ADDRESS SIGNALS ADa, ADb are decoded in the decoder 21 and a sector row arranged in lateral direction is selected. On the other hand, FIG. 5 provides a description of the case where, in addition to the decoding of ADDRESS SIGNALS ADa, ADb, SELECTION SIGNALS SEL0-SEL3 are provided when a detected voltage value of BIAS VOLTAGE VPP exceeds a predetermined voltage value.

Combinations of ADDRESS SIGNALS ADa, ADb and INVERTED ADDRESS SIGNALS /ADa, /ADb are inputted to AND gates A0-A3, wherein the AND gates A0-A3 output, respectively, DECODED SELECTION SIGNALS SEL0-SEL3. The AND gate A0 is fed a combination of INVERTED ADDRESS SIGNAL /ADa and INVERTED ADDRESS SIGNAL /ADb, and outputs SELECTION SIGNAL SEL0, as a result of which the second switch circuit SW0 is selected. The AND gate A1 is fed a combination of INVERTED ADDRESS SIGNAL /ADa and ADDRESS SIGNAL ADb, and outputs SELECTION SIGNAL SEL1, as a result of which the second switch circuit SW1 is selected. The AND gate A2 is fed a combination of ADDRESS SIGNAL ADa and INVERTED ADDRESS SIGNAL /ADb, and outputs SELECTION SIGNAL SEL2, as a result of which the second switch circuit SW2 is selected. And the AND gate A3 is fed a combination of ADDRESS SIGNAL ADa and ADDRESS SIGNAL ADb, and outputs SELECTION SIGNAL SEL3, as a result of which the second switch circuit SW3 is selected.

Each of the AND gates A0-A3 is further fed an output signal from a comparator CMP having two input terminals, i.e., a non-inverted input terminal and an inverted input terminal. The non-inverted input terminal of the comparator CMP is connected to a connection point of one end of a resistance element R3 and one end of a resistance element R4, and the inverted input terminal of the comparator CMP is fed REFERENCE VOLTAGE VRF2. The other end of the resistance element R3 is fed BIAS VOLTAGE VPP and the other end of the resistance element R4 is connected to ground voltage. The comparator CMP makes a comparison between a voltage (generated as a result of voltage division of BIAS VOLTAGE VPP by the resistance elements R3, R4) and REFERENCE VOLTAGE VRF2. When the divided voltage exceeds REFERENCE VOLTAGE VRF2, the comparator CMP provides an output signal at a high level, thereby enabling each of the AND gates A0-A3 to perform decode operations. Stated another way, when BIAS VOLTAGE VPP exceeds a predetermined voltage value determined by REFERENCE VOLTAGE VRF2, the decoder 21 becomes ready to perform decode operations. In addition, each of the AND gates A0-A3 may be provided in a plural number in association with COUNTER INFORMATION COUNT.

Accordingly, when an operation of applying a bias voltage to a target memory cell begins, the stepped up voltage supplying section 12 starts operating and the voltage level of BIAS VOLTAGE VPP rises. At the point of time when the BIAS VOLTAGE VPP exceeds a predetermined voltage level that is determined in accordance with REFERENCE VOLTAGE VRF2, the AND gates A0-A3 each perform a decode operation, whereby the second switch circuit SW0-SW3 is selected. It is not until BIAS VOLTAGE VPP reaches the predetermined voltage level that SELECTION SIGNALS SEL0-SEL3 are activated, and BIAS VOLTAGE VPP is never applied to the target memory cell until such time.

If the memory cell is a non-volatile memory cell, BIAS VOLTAGE VPP whose voltage level is less than the predetermined voltage level is never applied to the memory cell during PROGRAM or ERASE. Consequently, during PROGRAM or ERASE, BIAS VOLTAGE VPP whose voltage value falls outside the range of the predetermined voltage level is never applied to the memory cell, thereby rendering the program or erase operation reliable.

Figure 6:
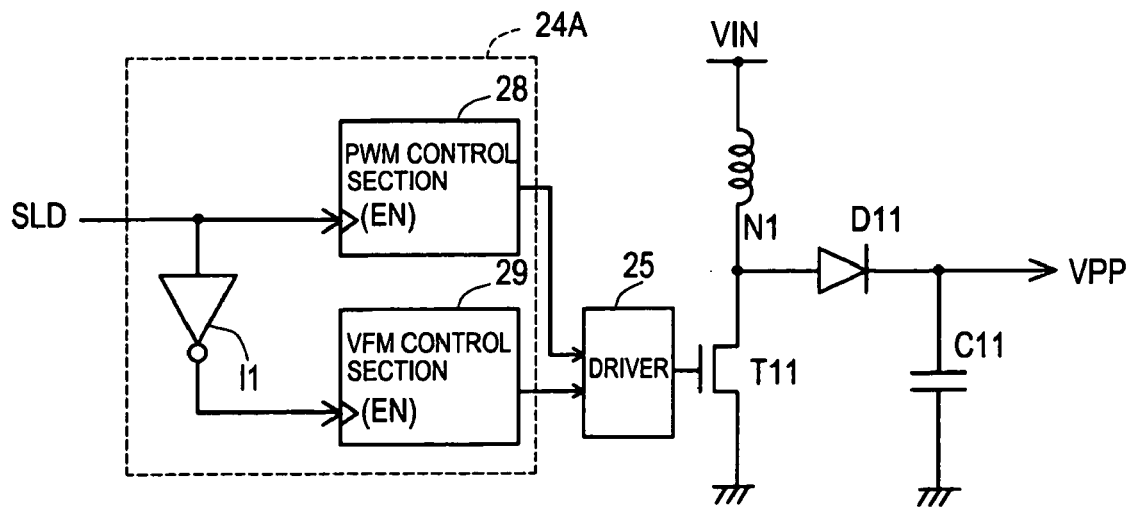
FIG. 6 is a block diagram showing an embodiment of a controller of the stepped up voltage supplying section in accordance with the embodiment of the present invention.
Figure 7:
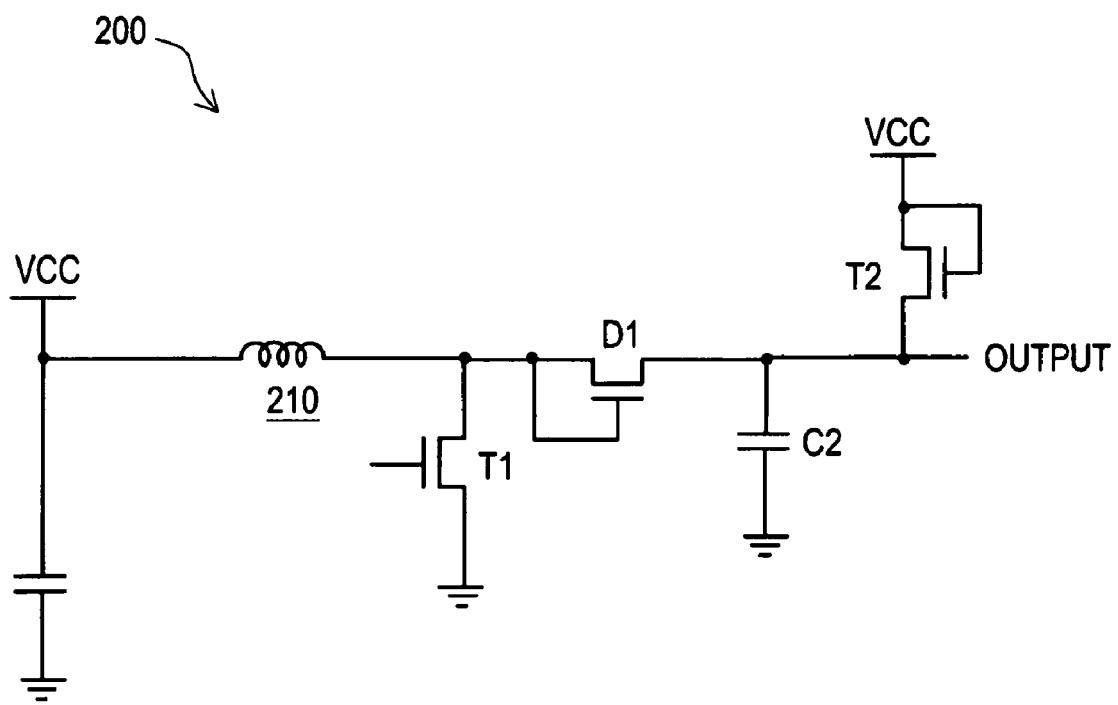
FIG. 7 is a circuit block diagram of a conventional memory device in accordance with Patent Document I.
Figure 8:
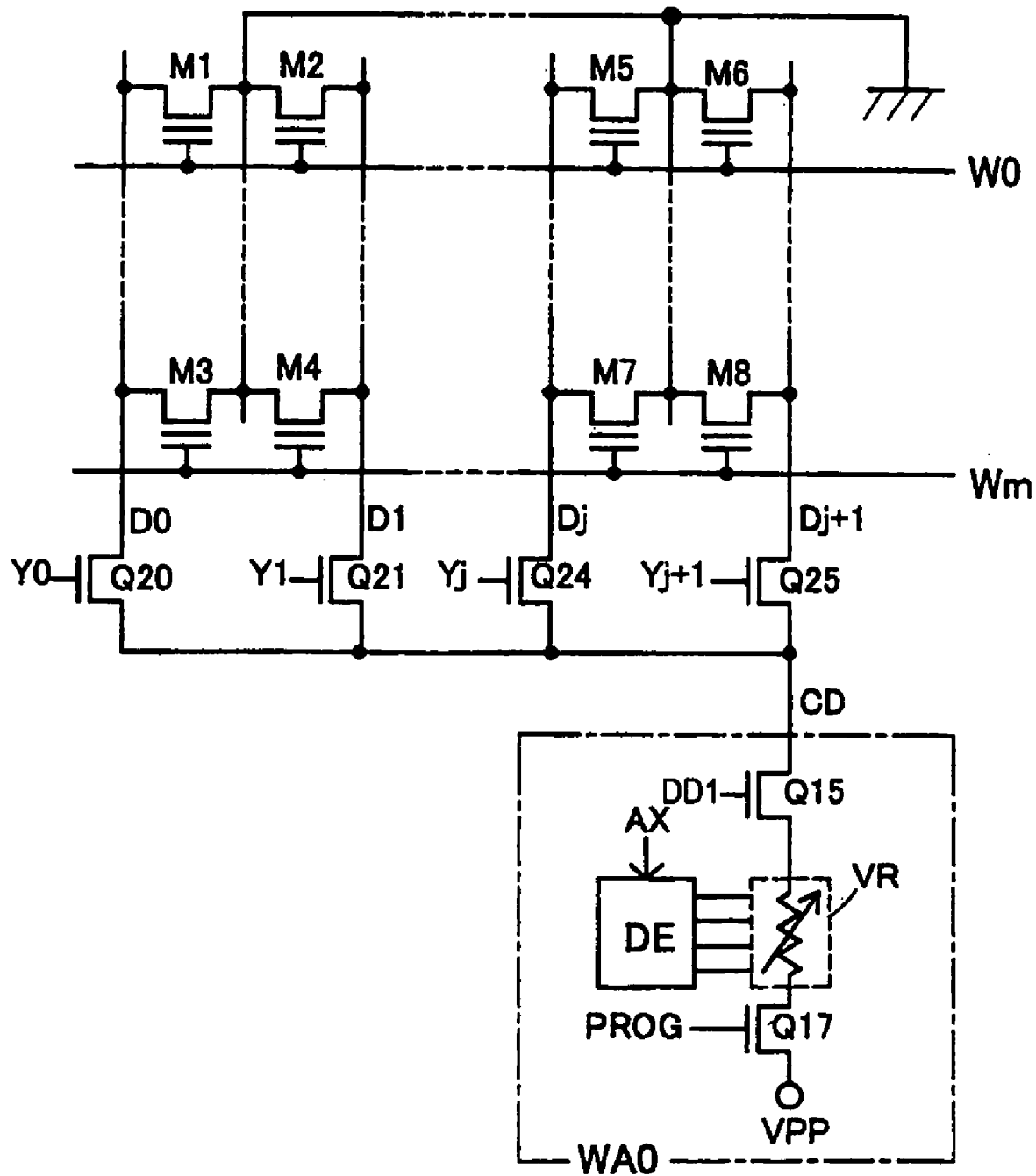
FIG. 8 is a circuit block diagram of a conventional memory device in accordance with Patent Document II.
Figure 9:
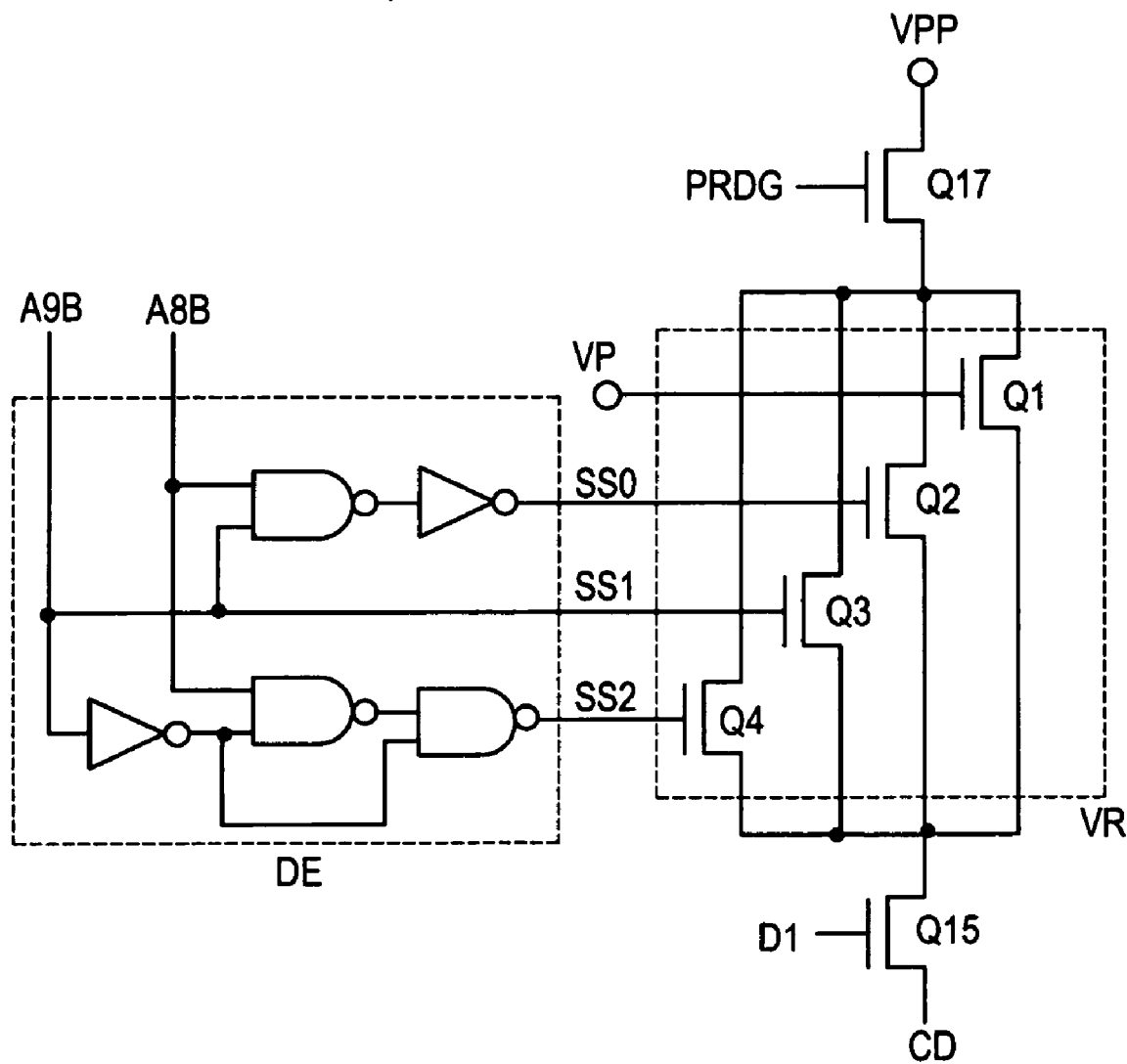
FIG. 9 is a specific example of a write load circuit WA0 in accordance with Patent Document II.

With reference to FIG. 6, there is illustrated an alternate embodiment of the controller 24 of the stepped up voltage supplying section 12 in accordance with the present invention. In FIG. 3, the controller 24 is described as providing, as a periodical control technique for maintaining BIAS VOLTAGE VPP at a predetermined voltage value, "PWM control" (which is an effective method when power consumption of BIAS VOLTAGE VPP is large) and "VFM control" (which is an effective method when the power consumption of BIAS VOLTAGE VPP is small). FIG. 6 shows an example in which these control techniques are switched depending on the load status of BIAS VOLTAGE VPP.

The controller 24A is provided with a PWM control section 28 and a VFM control section 29, the output signals of both being fed to the driver 25. The PWM control section 28 and the VFM control section 29 each have a respective enable terminal (EN). The enable terminal (EN) of the PWM control section 28 is fed LOAD SIGNAL SLD and the enable terminal (EN) of the VFM control section 29 is fed a signal as result of inverting LOAD SIGNAL SLD by an inverter gate I1. In response to LOAD SIGNAL SLD being at a high level, the PWM control section 28 is activated, and in response to LOAD SIGNAL SLD being at a low level the VFM control section 29 is activated.

LOAD SIGNAL SLD may be defined, for example, in response to the number of memory cells being targeted for simultaneous bias voltage application. In other words, if the number of memory cells as targets for simultaneous bias voltage application exceeds a predetermined value, then the load signal is placed in the logic high state, defining that the power consumption of BIAS VOLTAGE VPP is great. In this manner, the PWM control section 29 is activated and the stepped up voltage supplying section 12 provides a supply of BIAS VOLTAGE VPP by means of PWM control. On the other hand, when the number of memory cells as targets for simultaneous bias voltage application falls below the predetermined value, then the load signal is placed in the logic low state, defining that the power consumption of BIAS VOLTAGE VPP is small, and the VFM control section 28 is activated and the stepped up voltage supplying section 12 provides a supply of BIAS VOLTAGE VPP by means of VFM control.

The logical level of LOAD SIGNAL SLD may be set as follows. When a certain number of target memory cells can be selected by a single operation, LOAD SIGNAL SLD is placed in the logic high state in association with the setting of a mode of operation for selecting large numbers of memory cells. For example, when, during memory cell rewrite operation, the width of bits that are simultaneously accessed can be selected and when, in performing PROGRAM or ERASE in a non-volatile memory device, the batch operation range is made variable, are possible high state selections.

Alternatively, if, during an operation of applying BIAS VOLTAGE VPP to a large number of memory cells at the same time, the length of time taken to complete an operation differs from one memory cell to another, LOAD SIGNAL SLD is changed in logic level depending on the number of bias voltage applying operations. LOAD SIGNAL SLD is placed in the logic high state at the initial stage of a bias voltage applying operation that requires the application of BIAS VOLTAGE VPP to many memory cells. Then, after an elapse of a predetermined length of time and/or with the increase in the number of bias voltage application-completed memory cells, LOAD SIGNAL SLD is shifted to the logic low state. In the case where PROGRAM or ERASE is performed on a large number of memory cells, the length of time taken to complete the PROGRAM or ERASE operation generally differs from one memory cell to another. The status of memory cells is detected by verify operations for determining whether PROGRAM or ERASE is completed, and LOAD SIGNAL SLD may be shifted from the logic high state to the logic low state in response to detecting that verification of a predetermined number of memory cells is completed.

Furthermore, although the rectifier circuit is implemented by a diode, it may be implemented by a sync rectifier transistor. In this case, the first switch circuit and/or the rectifier circuit are controlled depending on the position of supplying a bias voltage to the memory cell array. In addition, the PWM control section and the VFM control section may be combined with the first switch circuit and/or the rectifier circuit.

As can be seen from the description above, in accordance with the embodiment of the present invention, even when for large storage capacity devices, the operation of releasing electric power stored in the inductance circuit L1 from INPUT VOLTAGE VIN towards the memory cell array 11 is periodically controlled so that STEPPED UP BIAS VOLTAGE VPP is maintained at a predetermined voltage level. This makes it possible to provide BIAS VOLTAGE VPP having a sufficient supply capability to the memory cell array 11. In addition, since the set voltage is regulated in response to the location of a memory cell as a target for bias voltage application within the memory cell array 11, the number of times the voltage is applied, the verify operation or other criteria, it is possible to release electric power stored in the inductance circuit L1 towards the memory cell array 11 from the rectifier circuit D1 by directly regulating BIAS VOLTAGE VPP. Regardless of the number of memory cells as application targets of BIAS VOLTAGE VPP, it is possible to supply OPTIMUM BIAS VOLTAGE VPP depending on the memory cell location. In addition, since the second switch circuits SW0-SW3 control BIAS VOLTAGE VPP to target memory cells when BIAS VOLTAGE VPP is at a predetermined voltage level, it is possible to perform ideal operations. Furthermore, since the PWM control section 28 and the VFM control section 29 are selectively switched by LOAD SIGNAL SLD indicative of a load status such as the number of memory cells to which bias voltage is applied at the same time, it is possible to perform efficient and ideal operations. If the rectifier circuit is implemented by a sync rectifier transistor, this makes it possible to perform efficient and ideal operations by controlling the first switch circuit and/or the rectifier circuit in response to the location of that a bias voltage is supplied in the memory cell array.

It should be noted that the present invention is not limited to the foregoing embodiments. As is readily apparent to those skilled in the art, various improvements and modification may be made without departing from the sprit of the present invention. For example, the voltage regulating section 13 for regulating BIAS VOLTAGE VPP has been described with reference to an example in which the ratio of voltage division of BIAS VOLTAGE VPP is set variable to regulate FEEDBACK VOLTAGE (REGULATION VOLTAGE) VFB. The present invention, however, is not limited to such a voltage regulating section. It is possible to regulate SET VOLTAGE VRF1 or to regulate both SET VOLTAGE VRF1 and FEEDBACK VOLTAGE (REGULATION VOLTAGE) VFB. In accordance with the embodiment, the description has been made in terms of an example where BIAS VOLTAGE VPP is voltage-divided and the resulting voltage is inputted to the error amplifier A11. The present invention, however, is not limited to such an example case. If a voltage as a result of converting the bias voltage at a given gain is inputted to the error amplifier A11, it is possible to amplify an error voltage having a voltage value deviating from that of the set voltage. Additionally, in the embodiment, the description has been made in terms of an example where BIAS VOLTAGE VPP suitable for the sector location information and the counter information is generated and controlled; however, BIAS VOLTAGE VPP may be controlled, separately, from the sector location information and the counter information.

Furthermore, for the case of non-volatile memory devices, the sector S00 is dealt with as a basic unit for BATCH ERASE or PROGRAM. Alternatively, for the case of other types of memory devices including non-volatile memory devices, a block made up of a certain number of memory cells may be dealt with as a basic unit for PAGE READ or BURST READ. Furthermore, in FIG. 2, for each vertical sector column, the layout region of memory cells is partitioned for every four sectors. It may alternatively be configured such that, for each vertical sector column, the memory cell layout region is partitioned for every two sectors. In addition, it may be configured such that four sectors are selected per every vertical sector column to form groups made up of two vertical sector rows. These may be achieved by address degeneracy control or other control technique. Additionally, the second switch circuits SW0-SW3 and the Y decoder 23 may be shared. Furthermore, the voltage regulating section 13 may be a circuit wherein BIAS VOLTAGE VPP is divided between the resistance element R1 and the resistance element R2 subjected to addition or subtraction.

Furthermore, the storage device of the present invention is made up of the memory cell array 11, the stepped up voltage supplying section 12, the voltage regulating section 13, and the memory controller 14; these components may be formed by one or be formed by more than one semiconductor devices. The inductance circuit L1 and the capacitor element C11 are not necessarily limited to semiconductor devices, and they do not have to be incorporated within a semiconductor device. It suffices if the storage device is made up of a combination of one or more silicon bulks and so-called discrete components, and its device form may be a single package form, a multi-package form, a hybrid form, or any other package form.

What is claimed is:

1. A storage device comprising:
a memory cell array;
a boosted-voltage supplying section which supplies a bias voltage to the memory cell array, the bias voltage being generated by boosting an input voltage; and
a voltage regulating section which regulates a set voltage wherein the voltage regulating section sets a voltage value of the bias voltage in response to at least any one of a position in the memory cell array which is to be supplied with the bias voltage, and/or a number of times that the bias voltage is applied to the memory cell array, and a verify operation after application of the bias voltage which outputs a regulated voltage regulated in response to at least one of the set voltage and the bias voltage,
wherein the boosted-voltage supplying section comprises:
an error-amplification circuit which amplifies an error voltage with a value deviated from the set voltage of the bias voltage in response to the set voltage and/or the regulated voltage after regulation thereof;
an inductance circuit coupled between the input voltage and a first node;
a first switch circuit coupled between the first node and a reference voltage; and
a rectifier circuit coupled between the first node and the memory cell array, the rectifier circuit being energized in a direction from the first node to the memory cell array,
wherein the first switch circuit, or the first switch circuit and the rectifier circuit is periodically energized in response to operation of the error-amplification circuit.

2. The storage device in accordance with claim 1, wherein the voltage regulating section regulates the bias voltage in response to address information corresponding to positional information related to the position of a memory cell in the memory cell array to which the bias voltage is to be supplied.

3. The storage device in accordance with claim 2, wherein the voltage regulating section regulates the bias voltage in response to redundancy information associated with the memory cell instead of address information associated therewith when the memory cell is remedied.

4. The storage device in accordance with claim 3, wherein the memory cell array includes a plurality of divided blocks, and
wherein the address information corresponds to the positional information identifying the plurality of divided blocks individually and the redundancy information includes the positional information identifying one of the plurality of divided blocks in which a redundant memory cell is located.

5. The storage device in accordance with claim 1, wherein the voltage regulating section regulates the bias voltage in response to a number of times that the bias voltage is applied to the memory cell array, and/or counter information which instructs a verify operation after the application of the bias voltage.

6. The storage device in accordance with claim 5, wherein the counter information is transmitted to a program/erase state machine which controls a program or an erase state.

7. The storage device in accordance with claim 1, wherein the voltage regulating section regulates gain of the set voltage and/or the bias voltage to be supplied to the error-amplification circuit.

8. The storage device in accordance with claim 7, wherein the set voltage and/or the bias voltage is divided and then supplied to the error-amplification circuit, and
wherein the voltage regulating section regulates a dividing ratio of the set voltage and/or the bias voltage.

9. The storage device in accordance with claim 1 further comprising a second switch circuit coupled between the rectifier circuit and the memory cell array, wherein the second switch circuit is energized when the bias voltage to be supplied to the memory cell array through the rectifier circuit is substantially equivalent to a predetermined voltage.

10. The storage device in accordance with claim 1 further comprising:
a first control section which energizes the first switch circuit when a load amount of the bias voltage set in response to the position in the memory cell array is less than or equal to a predetermined value; and
a second control section which energizes the first switch circuit when the load amount of the bias voltage set in response to the position in the memory cell array is greater than or equal to the predetermined value.

11. The storage device in accordance with claim 10, wherein the predetermined value of the load amount is determined in response to a number of memory cells which are to be simultaneously supplied with the bias voltage.

12. The storage device in accordance with claim 10, wherein the first control section is a VFM control section and the second control section is a PWM control section.

13. A method of controlling a storage device comprising the steps of:
regulating a set voltage of a bias voltage in response to at least any one of a position in a memory cell array which is to be supplied with the bias voltage, and/or a number of times that the bias voltage is applied to the memory cell array, and/or a verify operation after the application of the bias voltage which outputs a regulated voltage regulated in response to at least one of the set voltage and the bias voltage; and
managing the bias voltage in response to the set voltage by periodically storing power of an input voltage in an inductance circuit and then supplying the power to the memory cell array.

14. The control method in accordance with claim 13, wherein the regulating step includes regulating the bias voltage in response to address information corresponding to positional information of the position of a memory cell in the memory cell array to which the bias voltage is to be supplied.

15. The control method in accordance with claim 14, wherein the regulating step includes regulating the bias voltage in response to redundancy information instead of the address information when the memory cell is remedied.

16. The control method in accordance with claim 13, wherein the regulating step includes regulating the bias voltage in response to a number of times that the bias voltage is applied to the memory cell array, and/or a verify operation after the application of the bias voltage.

17. The control method in accordance with claim 13, wherein
the regulating step includes regulating a gain of the set voltage and/or the bias voltage; and
the bias voltage managing step includes amplifying an error voltage with a value deviated from the set voltage of the bias voltage in response to the set voltage and/or the regulated voltage, each having been regulated.

18. The control method in accordance with claim 13 further comprising the steps of:
storing power in the inductance circuit during a first cycle when a load amount of the bias voltage requested by the memory cell array is less than or equal to a predetermined value; and
storing the power in the inductance circuit during a second cycle when the load amount of the bias voltage requested by the memory cell array is greater than or equal to the predetermined value.

19. The control method in accordance with claim 18, wherein the first cycle is determined in response to a VFM control and the second cycle is determined in response to a PWM control.

* * * * *